US009552963B2

(12) United States Patent
Yoshitake (10) Patent No.: US 9,552,963 B2
(45) Date of Patent: Jan. 24, 2017

(54) CHARGED PARTICLE BEAM WRITING APPARATUS AND METHOD THEREFOR

(75) Inventor: Shusuke Yoshitake, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 598 days.

(21) Appl. No.: 13/049,399

(22) Filed: Mar. 16, 2011

(65) Prior Publication Data

US 2011/0231134 A1 Sep. 22, 2011

(30) Foreign Application Priority Data

Mar. 17, 2010 (JP) .................................. 2010-060334

(51) Int. Cl.
| | | |
|---|---|---|
| *G01C 17/38* | (2006.01) | |
| *G01B 5/30* | (2006.01) | |
| *H01J 37/317* | (2006.01) | |
| *G01N 23/18* | (2006.01) | |
| *B82Y 10/00* | (2011.01) | |
| *B82Y 40/00* | (2011.01) | |

(Continued)

(52) U.S. Cl.
CPC ............ *H01J 37/3174* (2013.01); *B82Y 10/00* (2013.01); *B82Y 40/00* (2013.01); *G01N 23/18* (2013.01); *G03F 1/24* (2013.01); *G03F 1/78* (2013.01)

(58) Field of Classification Search
CPC ....... G01N 23/18; G01N 21/9501; G03F 1/24; G03F 1/78
USPC .................................................... 702/40, 94
See application file for complete search history.

(56) References Cited

U.S. PATENT DOCUMENTS

| | | | | |
|---|---|---|---|---|
| 6,765,673 | B1* | 7/2004 | Higashikawa | ................ 356/399 |
| 2004/0175633 | A1* | 9/2004 | Shoki et al. | ....................... 430/5 |
| 2005/0238963 | A1* | 10/2005 | Ishibashi et al. | .................. 430/5 |

(Continued)

FOREIGN PATENT DOCUMENTS

| | | |
|---|---|---|
| JP | 06-273918 A | 9/1994 |
| JP | 2001-033941 A | 2/2001 |

(Continued)

OTHER PUBLICATIONS

Sean Huh et al., "Fiducial Mark for Defect Mitigation Technology", SEMATECH, Nov. 20, 2009, 19 Pages.

(Continued)

*Primary Examiner* — Michael Nghiem
(74) *Attorney, Agent, or Firm* — Oblon, McClelland, Maier & Neustadt, L.L.P.

(57) ABSTRACT

A charged particle beam writing apparatus includes a reading unit to read an identifier from a substrate where an absorber film which absorbs extreme ultraviolet light is formed and the identifier which can be optically read is formed, a storage unit to store defect position information indicating a position of a defect on the substrate based on reference marks, defect size information indicating a size of the defect, which are corresponding to the identifier, and pattern data for writing, an examination unit to input partial pattern data corresponding to a region including at least the defect in the pattern data, the defect position information based on reference marks, and the defect size information, and to examine whether a pattern layout is formed such that the defect is located in a region where the absorber film remains after patterning, and a writing unit to write a pattern on the substrate.

8 Claims, 10 Drawing Sheets

(51) Int. Cl.
G03F 1/24 (2012.01)
G03F 1/78 (2012.01)

(56) References Cited

U.S. PATENT DOCUMENTS

| | | | |
|---|---|---|---|
| 2007/0103659 A1* | 5/2007 | Yoshitake et al. | 355/53 |
| 2009/0325083 A1 | 12/2009 | Okubo et al. | 430/5 |
| 2010/0136464 A1* | 6/2010 | Hosoya | 430/5 |
| 2010/0203432 A1* | 8/2010 | Itoh | 430/5 |
| 2012/0216169 A1* | 8/2012 | Park et al. | 716/136 |
| 2015/0198896 A1* | 7/2015 | Abe | G03F 1/84 |
| | | | 438/7 |

FOREIGN PATENT DOCUMENTS

| | | | |
|---|---|---|---|
| JP | 2004-193269 | | 7/2004 |
| JP | 06273918 | * | 9/2004 |
| JP | 2010-8738 | | 1/2010 |

OTHER PUBLICATIONS

Office Action issued Dec. 24, 2013 in Japanese Patent Application No. 2010-060334 (with English language translation).
Office Action issued Aug. 5, 2014 in Japanese Patent Application No. 2010-060334 (with English translation).
Office Action issued on Jun. 30, 2015 in Japanese Patent Application No. 2014-220200 with English translation.

* cited by examiner

CHARGED PARTICLE BEAM WRITING APPARATUS AND METHOD THEREFOR

CROSS-REFERENCE TO RELATED APPLICATION

This application is based upon and claims the benefit of priority from the prior Japanese Patent Application No. 2010-060334 filed on Mar. 17, 2010 in Japan, the entire contents of which are included herein by reference.

BACKGROUND OF THE INVENTION

Field of the Invention

The present invention relates to a charged particle beam writing apparatus and a charged particle beam writing method. For example, it relates to a writing apparatus and a writing method for writing or "drawing" a pattern on a mask substrate using electron beams in order to manufacture a mask used for extreme ultraviolet (EUV) exposure.

The microlithography technique which advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam writing technique, which intrinsically has excellent resolution, is used for producing such a highly precise master pattern.

Figure 10:
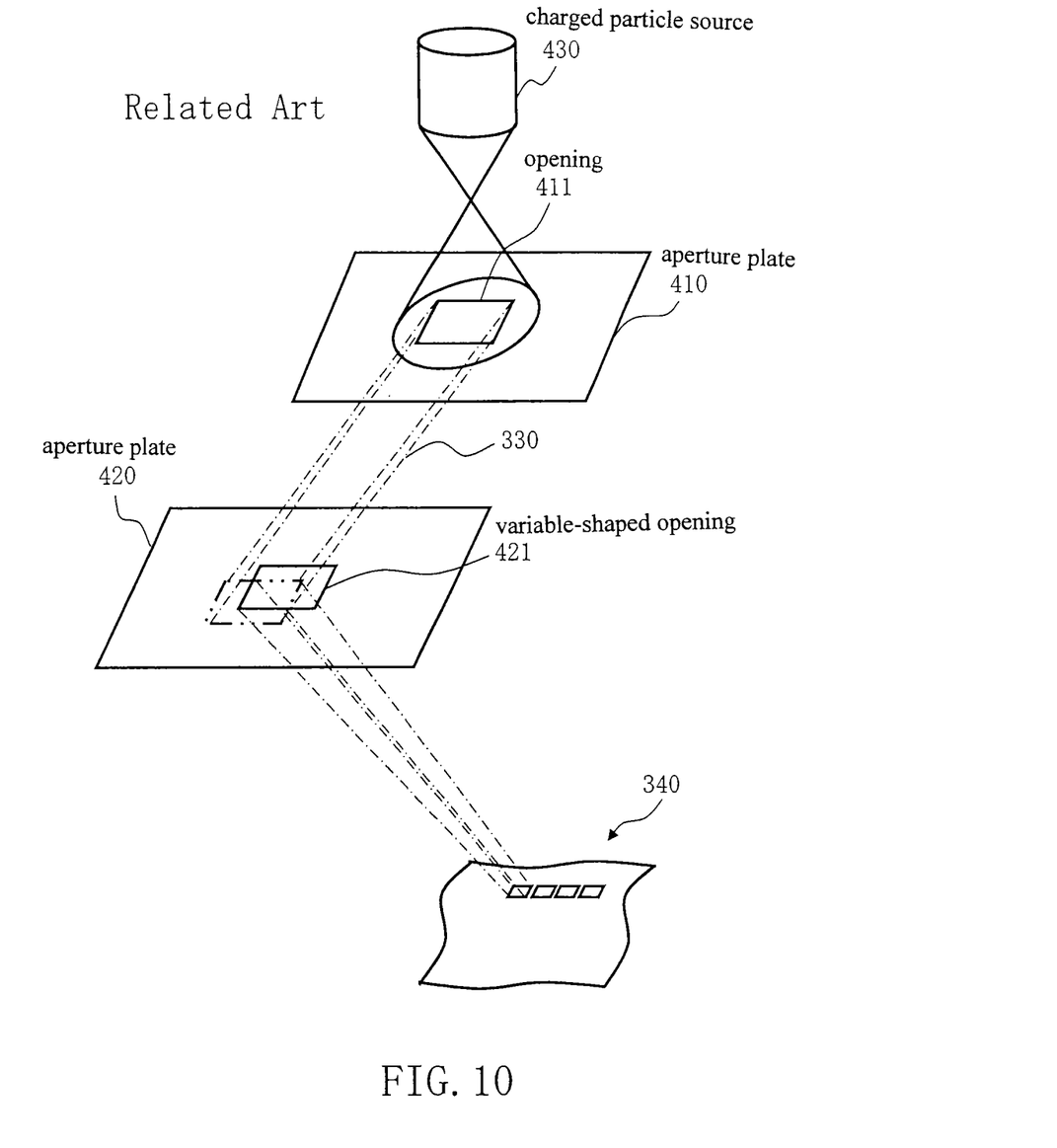
FIG. 10 is a schematic diagram for explaining operations of a variable-shaped electron beam type writing apparatus.

FIG. 10 is a schematic diagram for explaining operations of a variable-shaped electron beam (EB) type pattern writing apparatus. As shown in the figure, the variable-shaped electron beam writing apparatus operates as follows: A first aperture plate 410 has a quadrangular, such as a rectangular, opening 411 for shaping an electron beam 330. A second aperture plate 420 has a variable-shaped opening 421 for shaping the electron beam 330 that has passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. X direction) during the writing. In other words, a rectangular shape capable of passing through both the opening 411 and the variable-shaped opening 421 is used for pattern writing in the writing region of the target workpiece 340 on the stage. This method of forming a given shape by letting beams pass through both the opening 411 of the first aperture plate 410 and the variable-shaped opening 421 of the second aperture plate 420 is referred to as a variable shaped beam method.

Nowadays, in manufacturing advanced technology devices, deep ultraviolet (DUV) light with a wavelength of 193 nm is used as an exposure wavelength. With recent microminiaturization of semiconductor devices, further shortening the wavelength itself of exposure light is considered. Regarding developing new microlithography technique, light of 157 nm has been given up due to lack of lens material used for image reducing or transferring. For this reason, extreme ultraviolet (EUV) light with a wavelength of 13.4 nm is thought to be the most promising at present. Since the EUV light, whose wavelength is classified into the soft X-ray region, is transmitted and/or absorbed by many materials, it cannot form a projection optical system any longer. Therefore, a catoptric system is proposed for the exposure method using the EUV light. Thus, in the EUV lithography, a catoptric system composed of a multilayer mirror (mirror of multilayer film) which reflects EUV light is used. An EUV exposure mask intervenes as a part of the optical system. Therefore, a reflection type mask wherein a multilayer film is formed on the substrate is employed. The multilayer film formed by alternately layering molybdenum (Mo) and silicon (Si) is used.

Then, if the regularity of each layer thickness of these laminated layers breaks down, the phase of reflected light will be shifted. As a result, a phase defect will be exposed on the wafer. Thus, it is desirable that there is no defect on the surface of the multilayer substrate. Moreover, it is desirable to prevent particulate contamination which may generate a defect from being included in the multilayer film. Furthermore, since the EUV mask is a part of the catoptric system, irregularity of the mask surface will generate a shift of the phase of reflected light on the reflection surface. Consequently, a positional deviation of a pattern to be transferred or "printed" onto a wafer when exposing will be generated. Due to the reason described above, the substrate itself is required to have highly precise flatness.

However, it is difficult to completely reduce the defect rate on a substrate to zero, and if selecting only a substrate that has no defect or satisfies specification by inspecting all the manufactured masks, it makes the substrate expensive.

Then, there is disclosed a technique, in order for a defect not to be transferred or "printed" in the exposure processing, whereby a phase defect on a multilayer mask is prevented from being transferred or "printed" because it is structured such that, by moving an absorber pattern, the phase defect is included in the region of the absorber pattern (refer to, e.g., Japanese Patent Application Laid-open (JP-A) No. 2004-193269).

It is necessary to specify the position of a defect beforehand by an inspection apparatus which inspects particulate contamination of a mask blank (substrate), to reflect the specified position to the pattern data such that the pattern layout is shifted according to the specified position of the defect, and to certainly write the mask blank using the pattern data in which the pattern layout is shifted. However, since a plurality of mask blanks can be arranged in the pattern writing apparatus and a plurality of writing processing can be registered, there is a problem that the order of writing and mask blank to be used may be mistaken.

As described above, it is necessary to certainly write a substrate wherein a defect exists, by using writing data in which the pattern layout has been shifted based on the position of the defect. However, there have been problems: the order of writing and mask blank to be used may be mistaken, and pattern data, in which the pattern layout should have been shifted according to the position of a defect, may not include the defect in the region of the absorber pattern. Conventionally, sufficient methods for solving these problems have not been established.

BRIEF SUMMARY OF THE INVENTION

In accordance with one aspect of the present invention, a charged particle beam writing apparatus includes a reading unit configured to read an identifier (ID) from a substrate where an absorber film which absorbs extreme ultraviolet (EUV) light is formed and the identifier which can be optically read is formed; a storage unit configured to store defect position information indicating a position of a defect on the substrate based on reference marks, defect size information indicating a size of the defect, which are corresponding to the identifier, and pattern data for writing; an examination unit configured to input partial pattern data corresponding to a region including at least the defect in the pattern data, the defect position information based on the reference marks, and the defect size information, and to examine whether a pattern layout is formed such that the defect is located in a region where the absorber film remains after patterning; and a writing unit configured to write a pattern on the substrate using a charged particle beam, based on the pattern data in which the pattern layout is formed such that the defect is located in the region where the absorber film remains after patterning.

In accordance with one aspect of the present invention, a charged particle beam writing method includes reading an identifier (ID) from a substrate where an absorber film which absorbs extreme ultraviolet (EUV) light is formed and the identifier which can be optically read is formed, reading, from a storage unit which stores defect position information indicating a position of a defect on the substrate, defect size information indicating a size of the defect, which are corresponding to the identifier, and pattern data for writing, partial pattern data corresponding to a region including at least the defect in the pattern data, the defect position information, and the defect size information, and examining whether a pattern layout is formed such that the defect is located in a region where the absorber film remains after patterning, and writing a pattern on the substrate using a charged particle beam, based on the pattern data in which the pattern layout is formed such that the defect is located in the region where the absorber film remains after patterning.

DETAILED DESCRIPTION OF THE INVENTION

Embodiment 1

In the following Embodiment, there is described a structure using an electron beam as an example of a charged particle beam. The charged particle beam is not limited to the electron beam, and other charged particle beam, such as an ion beam, may also be used.

In the Embodiment hereafter described an apparatus and a method that can certainly write a substrate wherein a defect exists, by using writing data in which the defect is included in the region of an absorber pattern.

Figure 1:
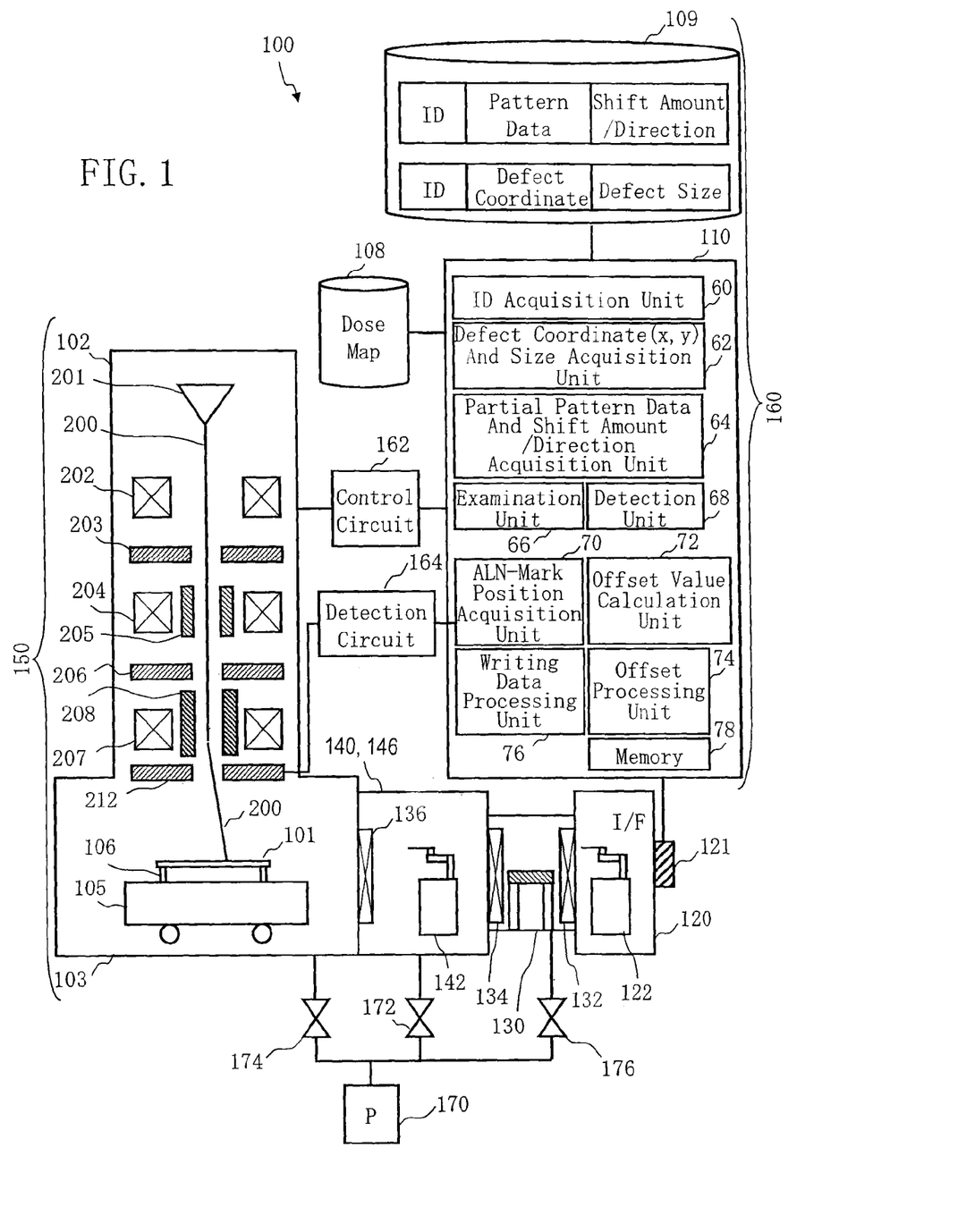
FIG. 1 is a schematic diagram showing a structure of a writing apparatus described in Embodiment 1.

FIG. 1 is a schematic diagram showing a structure of a writing apparatus described in Embodiment 1. In FIG. 1, a writing apparatus 100 is an example of a charged particle beam pattern writing apparatus. Specifically, an example of a variable-shaped electron beam writing apparatus is herein shown. The writing apparatus 100 includes a writing unit 150, a control unit 160, an interface unit (I/F) 120, a load lock (L/L) chamber 130, a robot (R) chamber 140, an alignment (ALN) chamber 146, and a vacuum pump 170. The writing apparatus 100 writes a desired pattern on a substrate 101 using an electron beam 200. The substrate 101 to be written includes a mask blank of the mask substrate for transferring or "printing" a pattern onto a semiconductor wafer using EUV light, for example.

The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, a deflector 208, and a detector 212. In the writing chamber 103, there is movably arranged an XY stage 105. When a pattern is written, a plurality of support pins 106 (an example of a holding unit) are arranged, up and down movably, on the XY stage 105, and the substrate 101 is placed or "supported" on the support pins 106. In the interface unit 120, a transfer robot 122 for carrying out the substrate 101 is arranged. In the robot chamber 140, a transfer robot 142 for transferring the substrate 101 is arranged. Moreover, in the interface unit 120, there is arranged a reader 121 which can optically read an ID (identifier) formed on the substrate 101.

The control unit 160 includes a computer unit 110, a control circuit 162, a detection circuit 164, and storage devices 108 and 109 such as a magnetic disk unit. The computer unit 110, the control circuit 162, the detection circuit 164, and the storage devices 108 and 109, such as a magnetic disk unit, are connected with each other via a bus (not shown).

The control circuit 162 controls the flow of data processed in a writing data processing unit 76, and controls and drives each device in the writing unit 150, the interface unit 120, the L/L chamber 130, the robot chamber 140, and the alignment chamber 146. ID read by the reader 121 is output to the computer unit 110, and data detected by the detector 212 is also output to the computer unit 110.

In the control computer unit 110, there are arranged an ID acquisition unit 60 (a unit for acquiring an ID), a defect coordinate/size acquisition unit 62 (a unit for acquiring a coordinate and/or size of a defect), a partial pattern data and shift amount/direction acquisition unit 64 (a unit for acquiring partial pattern data and an amount and/or direction of shifting), an examination unit 66, a detection unit 68, an ALN-mark position acquisition unit 70 (a unit for acquiring a position of an ALN (alignment) mark), an offset value calculation unit 72, an offset processing unit 74, a writing data processing unit 76, and a memory 78. Each of the functions of the ID acquisition unit 60, the defect coordinate/size acquisition unit 62, the partial pattern data and shift amount/direction acquisition unit 64, the examination unit 66, the detection unit 68, the ALN-mark position acquisition unit 70, the offset value calculation unit 72, the offset processing unit 74, and the writing data processing unit 76 may be configured by software, such as a program causing a computer to perform the actions. Alternatively, each function of them may be configured by hardware, such as an electrical device or an electronic device. Alternatively, it may be configured by a combination of hardware and software, or a combination of hardware and firmware. Input data and calculation processing data which are processed by each of the above functions are stored in the memory 78 each time.

The vacuum pump 170 exhausts the gas in the robot chamber 140 and the alignment chamber 146 through a valve 172. Thereby, the insides of the robot chamber 140 and the alignment chamber 146 are maintained to be vacuum atmosphere. Moreover, the vacuum pump 170 exhausts the gas in the electron lens barrel 102 and the writing chamber 103 through a valve 174. Thereby, the insides of the electron lens barrel 102 and the writing chamber 103 are maintained to be vacuum atmosphere. Moreover, the vacuum pump 170 exhausts the gas in the load lock chamber 130 through a valve 176. Thereby, the inside of the load lock chamber 130 is controlled to be vacuum atmosphere as needed. In addition, gate valves 132, 134, and 136 are placed at each boundary among the interface unit 120, the load lock chamber 130, the robot chamber 140, and the writing chamber 103.

In FIG. 1, structure elements necessary for explaining Embodiment 1 are described. In addition, other structure elements usually necessary for the writing apparatus 100 may also be included. A multiaxial robot can be used as an example of the transfer robots 122 and 142. It is satisfactory for the transfer robots 122 and 142 to be a mechanical system, such as an elevating mechanism or a rotating mechanism.

Figure 2:
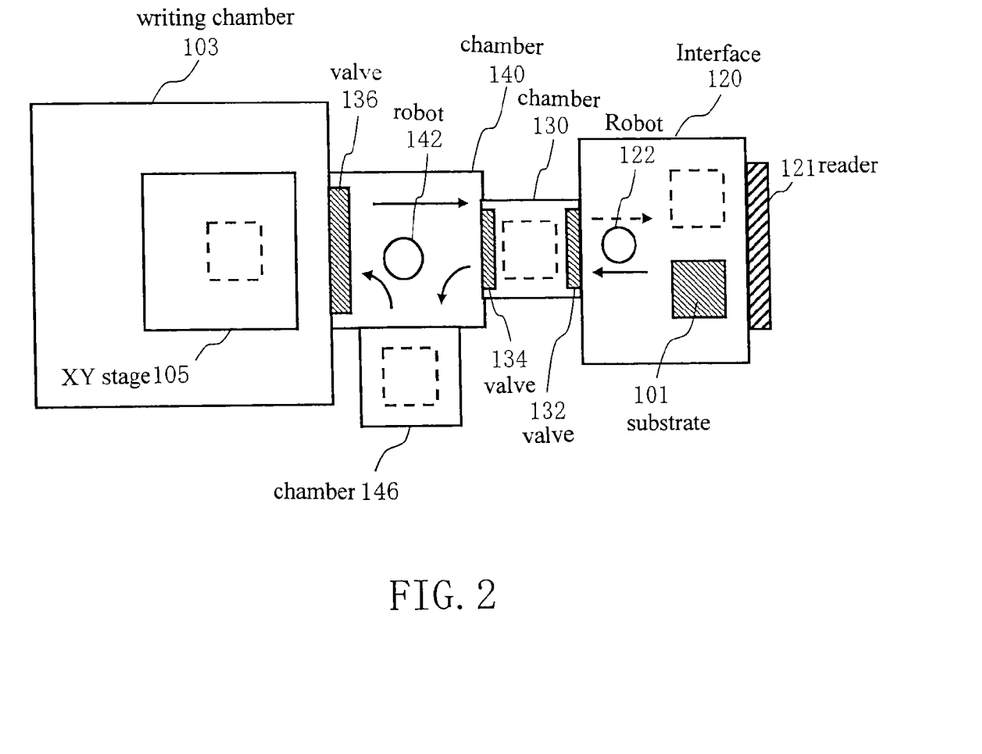
FIG. 2 is a schematic diagram showing an example of a transfer route of a substrate in a writing apparatus according to Embodiment 1.

FIG. 2 is a schematic diagram showing an example of a transfer route of the substrate in the pattern writing apparatus according to Embodiment 1. After the ID on the substrate 101 is read by the reader 121, the substrate 101 arranged in the interface unit 120 is loaded, after the gate valve 132 is opened, onto the support member in the L/L chamber 130 by the transfer robot 122. Then, after the gate valve 132 is closed, the inside of the L/L chamber 130 is made to be a vacuum atmosphere by the vacuum pump 170. Next, after the gate valve 134 is opened, the substrate 101 loaded on the support member in the L/L chamber 130 is transferred to the stage in the alignment chamber 146 by the transfer robot 142 through the robot chamber 140. Then, the substrate 101 is aligned. Next, after the gate valve 136 is opened, the substrate 101 loaded on the stage in the alignment chamber 146 is transferred to the inside of the writing chamber 103 by the transfer robot 142 through the robot chamber 140. In this way, the substrate 101 is transferred or "delivered" to the writing chamber 103. Then, a pattern is written on the substrate 101 in the writing chamber 103. After the substrate 101 has been transferred or "delivered" to the writing chamber 103, the writing unit 150 operates as follows under the control of the control circuit 162.

The writing unit 150 writes a pattern, with the electron beam 200, on the substrate 101 placed on the support pins 106 in the writing chamber 103. Specifically, the following operation is performed. The electron beam 200 emitted from the electron gun assembly 201, being an example of an emitting unit, irradiates the whole of the first aperture plate 203, which has a quadrangular opening such as a rectangular opening, using the illumination lens 202. At this point, the electron beam 200 is shaped to be a quadrangle such as a rectangle. Then, after having passed through the opening of the first aperture plate 203, the electron beam 200 of a first aperture image is projected onto the second aperture plate 206 by the projection lens 204. The position of the first aperture image on the second aperture plate 206 is deflection-controlled by the deflector 205 so as to change the shape and size of the beam. Thereby, the electron beam 200 is formed to be shaped. After having passed through the second aperture plate 206, the electron beam 200 of a second aperture image is focused by the objective lens 207 and deflected by the deflector 208, to reach a desired position on the target workpiece 101 placed on the XY stage 105 which moves continuously.

After writing and then opening the gate valves 134 and 136, the substrate 101 is transferred or "delivered" onto the support member in the L/L chamber 130 by the transfer robot 142 through the robot chamber 140. After the gate valve 134 is closed, the inside of the L/L chamber 130 is returned to the atmosphere of atmospheric pressure. Then, after the gate valve 132 is opened, the substrate 101 is arranged in the interface unit 120 by the transfer robot 122.

Figure 3A:
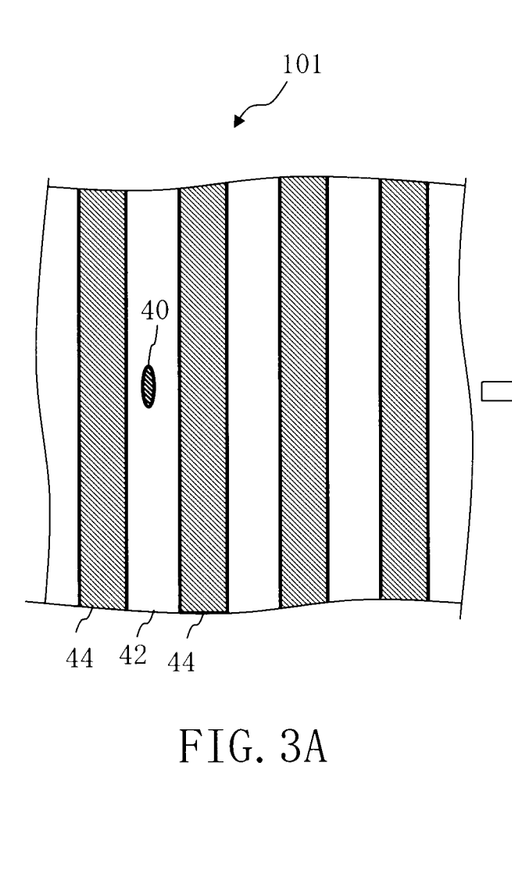
FIGS. 3A and 3B are schematic diagrams showing examples of the upper surface of an EUV mask in which a defect exists according to Embodiment 1.
Figure 3B:
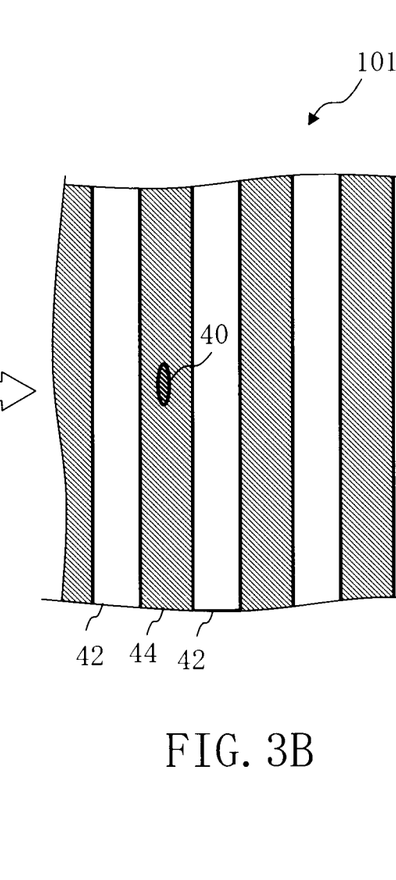
Figure 4A:
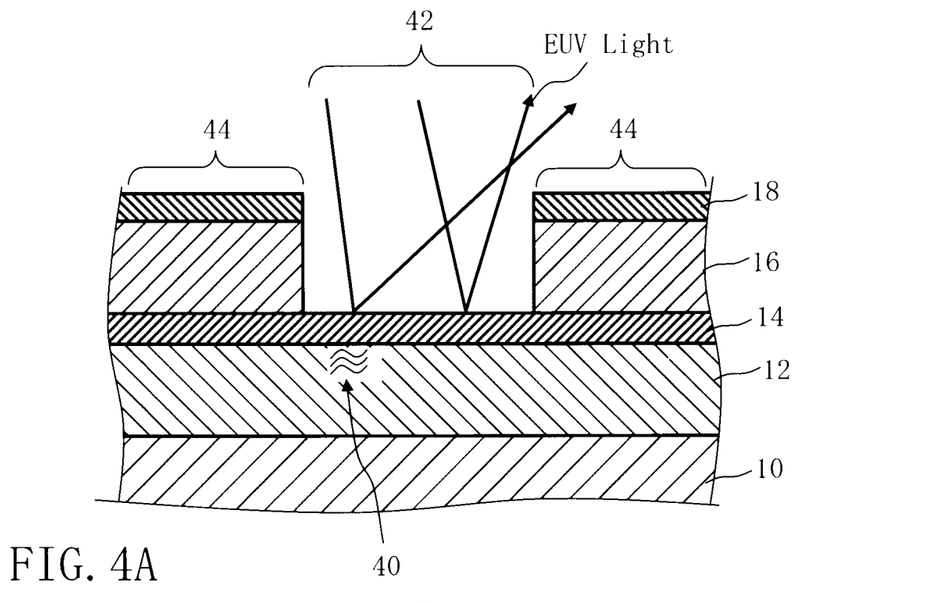
FIGS. 4A and 4B are schematic diagrams showing sections of the EUV mask of FIGS. 3A and 3B.
Figure 4B:
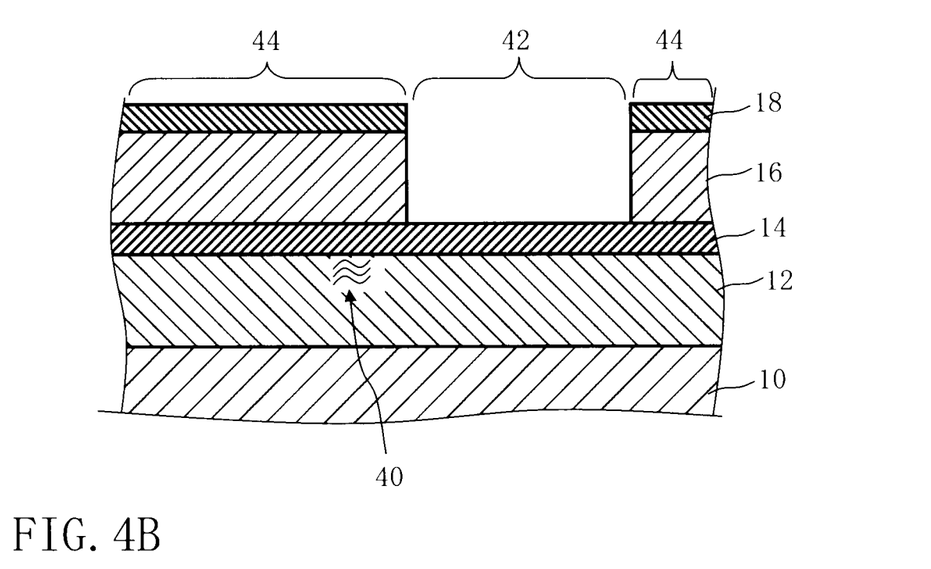

FIGS. 3A and 3B are schematic diagrams showing examples of the upper surface of an EUV mask in which a defect exists according to Embodiment 1. FIGS. 4A and 4B are schematic diagrams showing sections of the EUV mask of FIGS. 3A and 3B. The EUV mask is formed in a manner such that a multilayer film 12 of, for example, forty laminated layers of alternately laminated molybdenum (Mo) of 2.9 nm thick and silicon (Si) of 4.1 nm thick is applied all over the surface of a glass substrate 10. A cap film 14, such as ruthenium (Ru), is applied on the whole surface of the multilayer film 12. The cap film 14 is exposed in the region where EUV light is reflected. By contrast, in the region where EUV light is not reflected, an absorber film 16 which absorbs EUV light and an antireflection film 18 are formed in order on the cap film 14. As shown in FIGS. 3A and 4A, if a defect 40 of the multilayer film 12 exists in a region 42 where the absorber film 16 does not exist, since the periodicity of the multilayer film becomes irregular, the phase of the reflected EUV light is shifted. As a result, when a pattern is transferred or "printed" onto a semiconductor wafer by using this EUV mask, the phase of the light is shifted at the defective part and thereby lights negate each other. Consequently, since the intensity of the reflected light which is led to the wafer becomes weakened by the interference, the pattern cannot be resolved, thereby becoming an unexposed part to be a defect. Thus, according to Embodiment 1, as shown in FIGS. 3B and 4B, writing is performed using the data in which the pattern layout has been shifted from the position shown in FIGS. 3A and 4A so that the position of the defect 40 may be in a region 44 where the absorber film 16 exists after patterning. To explain specifically, patterning on the substrate 101 is performed as follows: writing the substrate 101 being an EUV mask blank applied with a resist film 20 by the writing apparatus 100, developing the resist, etching the antireflection film 18 and the absorber film 16 by using the resist pattern, as a mask, which is formed by the resist film 20 remaining after the development, and removing the remaining resist film 20 by performing asking. Through such patterning, the EUV mask is manufactured. Then, after the patterning, when writing is performed using the writing apparatus 100, the pattern layout is shifted such that the position of the defect 40 is in the region 44 where the absorber film 16 exists. In order to shift the pattern layout, first, it is necessary to specify the position of the defect. Therefore, before writing, a defect inspection of the substrate 101 is performed by a particulate contamination inspection apparatus in order to detect the position of a substrate defect causing a multilayer film irregularity which causes a phase defect (not shown).

Figure 5:
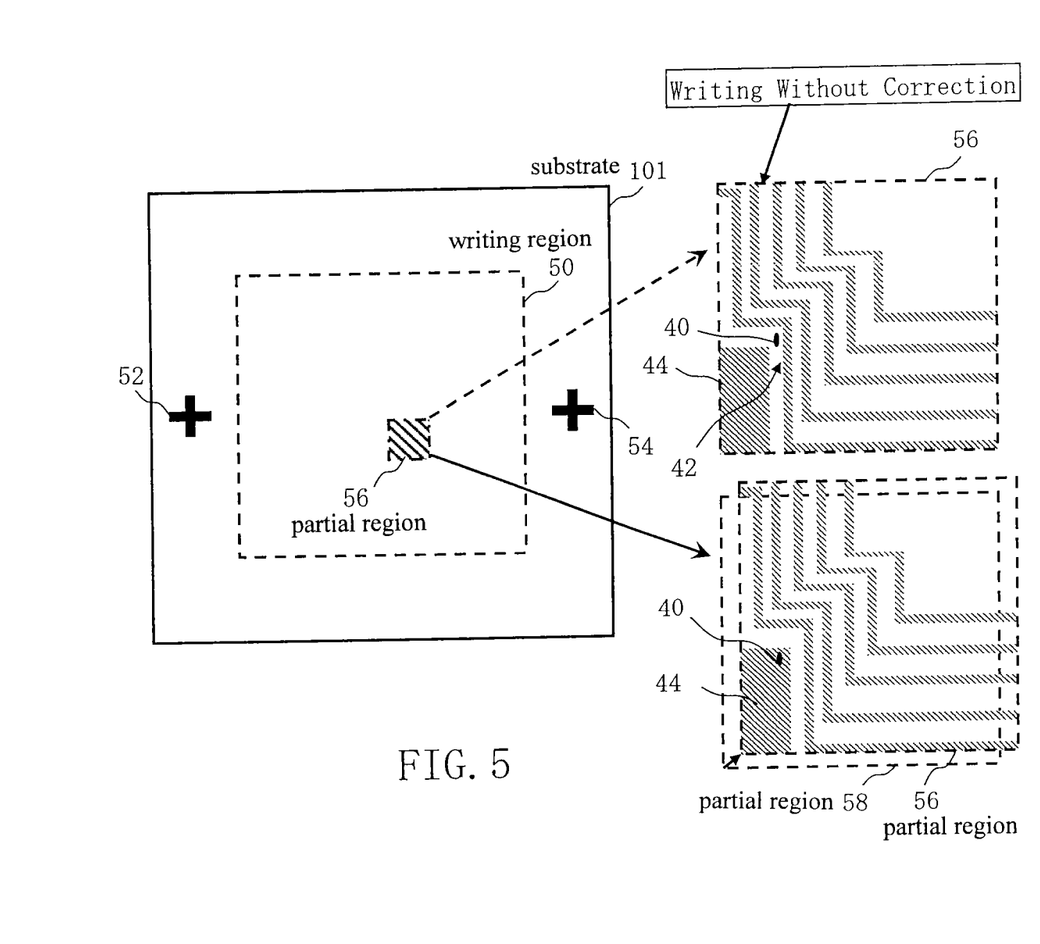
FIG. 5 is a schematic diagram showing an example of writing a pattern on a substrate where a defect exists according to Embodiment 1.

FIG. 5 is a schematic diagram showing an example of writing a pattern on a substrate where a defect exists according to Embodiment 1. ALN-marks 52 and 54 are formed on the surface of the substrate 101. An particulate contamination inspection apparatus, which can inspect a substrate defect causing a multilayer film irregularity that causes a phase defect, examines the existence or nonexistence of the defect 40 on the substrate, and measures a defect position and a defect size on the basis of the ALN-marks 52 and 54. Thus, the user can acquire information on a defect position and a defect size on the basis of the positions of the ALN-marks 52 and 54 in advance before writing. For example, a defect position can be represented by coordinates (x, y) of the center position of the defect on the basis of the coordinates of the positions of the ALN-marks 52 and 54. A defect size can be represented by the diameter (D) of a circle which has been extended up to the maximum outline of the defect while centering the coordinates of the defect position. Having acquired information on the defect position and the defect size, after patterning, the user generates pattern data in which the pattern layout has been shifted in order for the position of the defect 40 to be in the region 44 where the absorber film 16 exists.

For example, FIG. 5 shows the case where the defect 40 exists in a partial region 56 in the writing region 50 of the substrate 101. If writing is performed using the pattern layout as it is, since the defect 40 is located in the region 42 where the absorber film 16 does not exist, a phase defect will be generated. On the other hand, according to Embodiment 1, the writing pattern data is corrected so that the defect 40 may be located in the region 44 where the absorber film 16 exists, by shifting the pattern layout to change the partial region 56 to a partial region 58 while treating the positions of the ALN-marks 52 and 54 as coordinate references. Then, information on the shift amount and the shift direction which have been used for shifting the pattern layout is defined as, for example, attribute data in the writing pattern data. For example, coordinates (x, y) of the position shifted on the basis of the coordinates of the positions of the ALN-marks 52 and 54 are defined. Based on the coordinates (x, y), the shift amount and the shift direction of the shifted pattern layout can be specified. Then, the writing pattern data, in which the shift amount and the shift direction having been used for shifting the pattern layout are defined, is input from the outside and stored in the storage device 109.

Figure 6:
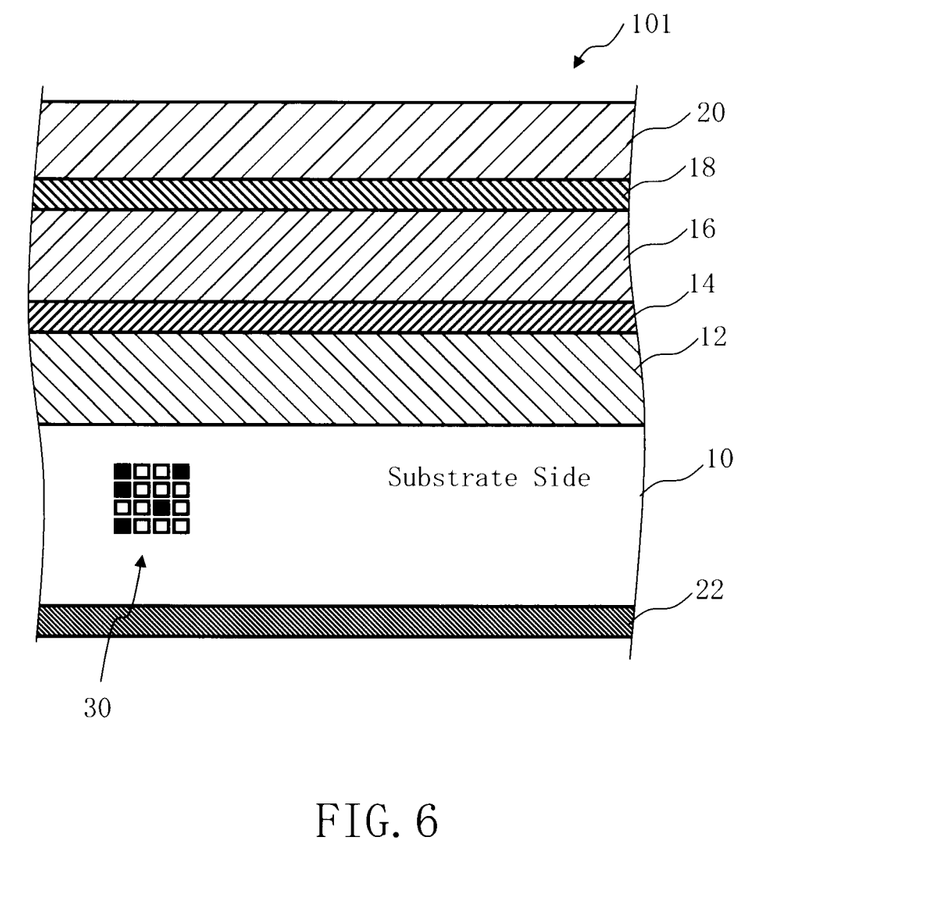
FIG. 6 is a schematic diagram showing a section of the substrate to be written according to Embodiment 1.

FIG. 6 is a schematic diagram showing a section of the substrate to be written according to Embodiment 1. In FIG. 6, the substrate 101 being a writing target is configured as follows: on the low thermal expansion glass substrate 10, there is formed the multilayer film 12 of, for example, forty laminated layers of alternately laminated molybdenum (Mo) of 2.9 nm thick and silicon (Si) of 4.1 nm thick. On the whole surface of the multilayer film 12, the cap film 14, such as ruthenium (Ru), is formed. On the whole surface of the cap film 14, the absorber film 16 which absorbs EUV light and the antireflection film 18 are applied in order. For example, tantalum (Ta) is used as the main material of the absorber film 16 and the antireflection film 18. The resist film 20 is formed on the antireflection film 18. In the case of a positive resist material being used, the region 44 where the absorber film 16 remains after patterning is a non-irradiation region (non-writing region) of the electron beam 200, and the region 42 where the absorber film 16 does not remain is an irradiation region (writing region) of the electron beam 200. In the case of a negative resist material being used, the region 44 where the absorber film 16 remains after patterning is an irradiation region (writing region) of the electron beam 200, and the region 42 where the absorber film 16 does not remain is an non-irradiation region (non-writing region) of the electron beam 200. Moreover, a conductive film 22, such as chromium nitride (CrN), is formed on the backside of the glass substrate 10.

An ID 30, which can be optically read by the reader 121, is encoded and formed on the side of the glass substrate 10. The ID 30 is represented in data matrices specified by the SEMI standard, for example. Substrate information related to the ID 30 is input from the outside and stored in the memory 109. As the substrate information, there is defined information on a defect position and a defect size on the basis of the positions of the ALN-marks 52 and 54, measured by a phase defect inspection apparatus in advance before setting the substrate 101 in the writing apparatus 100. For example, a defect position can be represented by coordinates (x2, y2) of the center position of the defect, on the basis of the coordinates of the positions of the ALN-marks 52 and 54. A defect size can be represented by the diameter (D) of a circle which has been extended up to the maximum outline of the defect while centering the coordinates of the defect position.

Although the pattern data and the substrate information are stored in one storage device 109 according to FIG. 1, it is not limited thereto. It should be understood that they may be stored in separate storage devices. Moreover, it is also preferable that the pattern data is associated with the ID described above.

Figure 7:
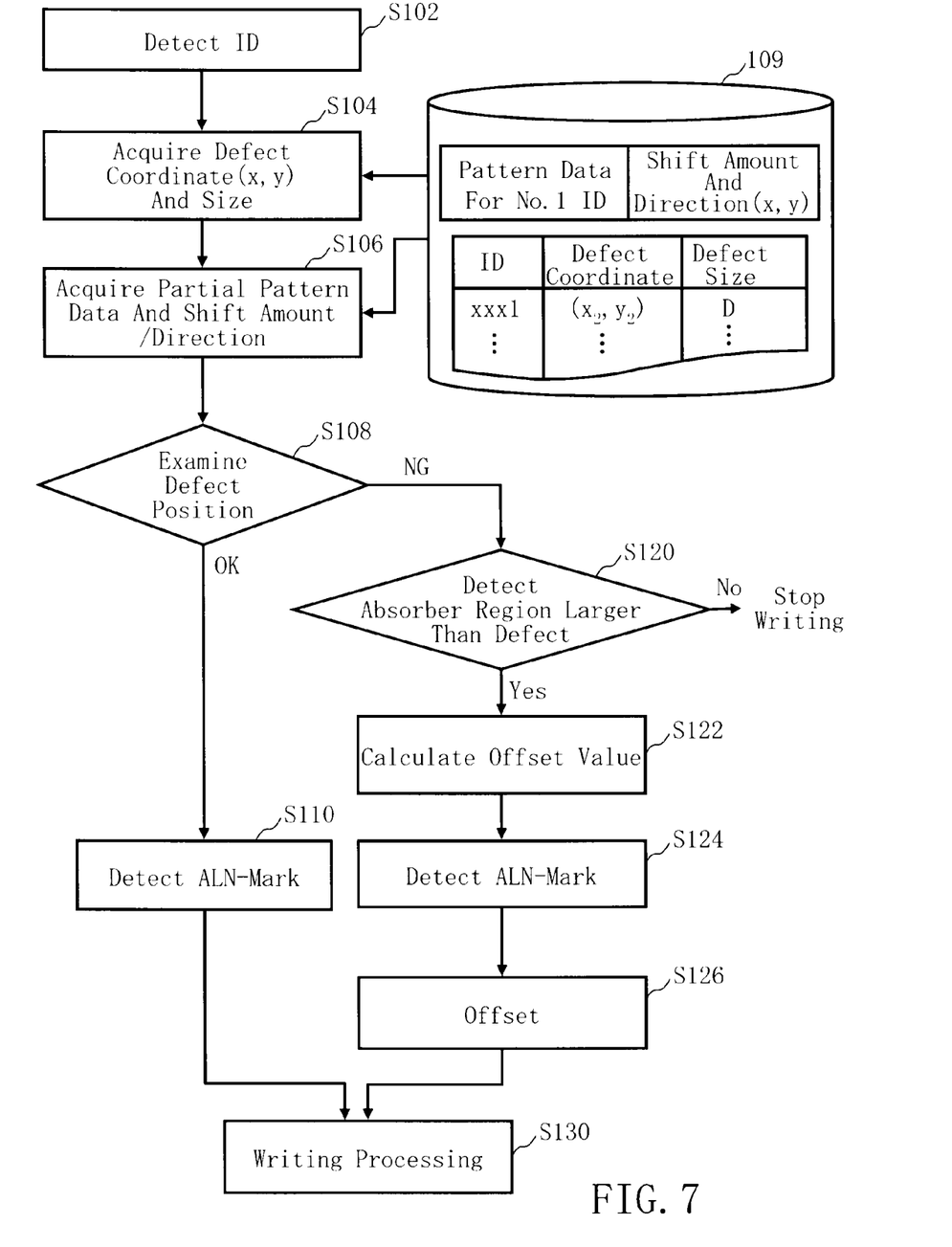
FIG. 7 is a flowchart showing main steps of the writing method according to Embodiment 1.

FIG. 7 is a flowchart showing the main steps of the writing method according to Embodiment 1. In FIG. 7, the writing method of Embodiment 1 executes a series of steps: an ID acquisition step (S102), a defect coordinate/size acquisition step (S104), a partial pattern data and shift amount/direction acquisition step (S106), an examination step (S108), an ALN-mark detection step (S110), an absorber region detection step (S120), an offset value calculation step (S122), an ALN-mark detection step (S124), an offset step (S126), and a writing processing step (S130).

First, according to an indication of the control circuit 162, the writing data processing unit 76 reads the pattern data stored in the storage device 109, and generates shot data unique to the pattern writing apparatus by performing data conversion processing of several steps. In this procedure, the writing region is virtually divided into grid-like meshes and a dose map is generated in which an irradiation dose for each mesh is defined. The writing data processing unit 76 serves as an example of a dose map generation unit. The dose map is stored in the storage device 108. Parallel to this processing, the pattern data and the substrate are specified as follows:

In step S102, as the ID acquisition step, when the substrate 101 is arranged in the interface unit 120, the reader 121 reads the ID 30 from the substrate 101. The ID acquisition unit 60 inputs the ID 30 from the reader 121 and acquires it. The reader 121 and the ID acquisition unit 60 serve as examples of a reading unit.

In step S104, as the defect coordinate/size acquisition step, the defect coordinate/size acquisition unit 62 refers to the substrate information stored in the storage device 109, and reads defect position information indicating a position of the defect 40 on the substrate 101 and defect size information indicating a size of the defect 40 on the substrate 101, which are corresponding to the read ID 30.

In step S106, as the partial pattern data and shift amount/direction acquisition step, the partial pattern data and shift amount/direction acquisition unit 64 inputs partial pattern data corresponding to a region including at least the defect 40 in the pattern data stored in the storage device 109. Simultaneously, the partial pattern data and shift amount/direction acquisition unit 64 inputs information on the shift amount and the shift direction which have been used for shifting the pattern layout.

In step S108, as the examination step, the examination unit 66 inputs the partial pattern data corresponding to a region including at least the defect, the defect position information, and the defect size information, and examines whether the pattern layout is formed such that the defect 40 is located in the region 44 where the absorber film 16 remains after patterning. By overlapping the layout of the partial pattern defined by the partial pattern data with the coordinates according to the defect position information and the size according to the defect size information, it can be examined whether the whole of the defect 40 is included in the region 44 where the absorber film 16 remains. For example, in the case of a positive type resist being used, the non-irradiation region (non-writing region) of the electron beam 200 is the region 44 where the absorber film 16 remains after patterning. In the case of a negative type resist being used, the irradiation region (writing region) of the electron beam 200 is the region 44 where the absorber film 16 remains after patterning. Therefore, the examination can be achieved if it is known from the partial pattern data whether the region is to be irradiated by the electron beam 200 or not. As a result of the examination, when the defect 40 is located in the region 44 where the absorber film 16 remains after patterning (that is, when OK in FIG. 7), it goes to the ALN-mark detection step (S110). When the defect 40 is not located in the region 44 where the absorber film 16 remains after patterning (that is, when NG in FIG. 7), it goes to the absorber region detection step (S120). The examination result is output by an output unit (not shown). Then, it is output, for example, to a monitor, a printer, etc., or it may be output to the outside. Alternatively, it may be stored in the storage device 108, 109, etc.

According to Embodiment 1, as described above, it is examined whether the pattern layout is formed such that the defect 40 is located in the region 44 where the absorber film 16 remains after patterning, by using actual writing pattern data and substrate information which is correlated with the ID formed on the actual substrate 101. Thereby, whether the combination of the pattern data to be used and the substrate 101 to be written is appropriate or not can be judged. Furthermore, since the examination is performed using actual writing pattern data, and the defect position and defect size on the substrate information, it is possible to examine whether, by using the pattern data, the pattern layout is shifted such that the defect position is actually hidden in the absorber film 16 or not. Thus, the certainty can be improved more than that of the examination by just judging the correlation between the substrate ID and its pattern data.

In step S110, as the ALN-mark detection step, the writing unit 150 moves the XY stage 105 to the position at which the ALN-marks 52 and 54 can be irradiated by the electron beam 200, scans the ALN-marks 52 and 54, and detects the positions of the ALN-marks 52 and 54. In this procedure, reflection electron etc. of the irradiating electron beam 200 is detected by the detector 212 and output to the detection circuit 164. In the detection circuit 164, the positions of the ALN-marks 52 and 54 are converted into digital signals and output to the computer unit 110. The ALN-mark position acquisition unit 70 acquires the positions of ALN-marks 52 and 54 by inputting the position information on the ALN-marks 52 and 54 which was output from the detection circuit 164.

In step S130, as the writing processing step, the writing unit 150 writes a pattern on the substrate 101 using the electron beam 200, based on the pattern data in which the pattern layout is formed such that the defect 40 is located in the region 44 where the absorber film 16 remains after patterning. At this time, at least one of the positions of the ALN-marks 52 and 54 is used as a reference of the writing coordinates. Thereby, the defect can be certainly located in the region 44 where the absorber film 16 remains.

As described above, when an examination result of OK is obtained at the examination step (S108), the pattern data stored in the storage device 109 can be used as it is. However, when an examination result of NG is obtained at the examination step (S108), if the pattern data is used as it is, an EUV mask with a phase defect will be manufactured. Thus, in such a case, a writing position is corrected according to Embodiment 1.

In step S120, as the absorber region detection step, when, as a result of the inspection, the defect 40 is not located in the region 44 where the absorber film 16 remains after patterning, the detection unit 68 detects the region 44 where the absorber film 16 remains after patterning. If it is impossible to detect the region 44, the writing is stopped.

Figure 8A:
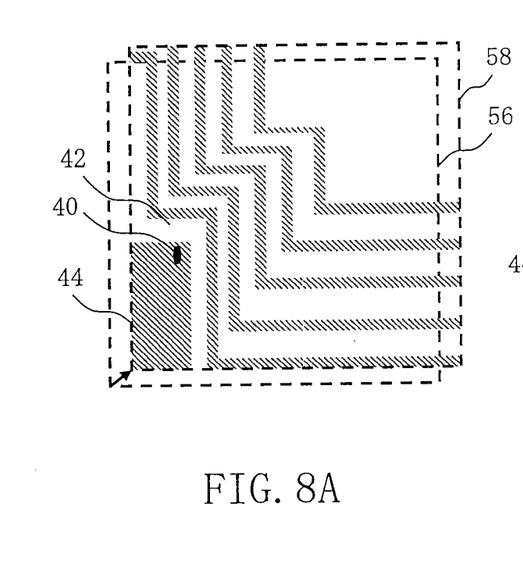
FIGS. 8A and 8B are schematic diagrams showing examples of the defect position having been shifted according to Embodiment 1.
Figure 8B:
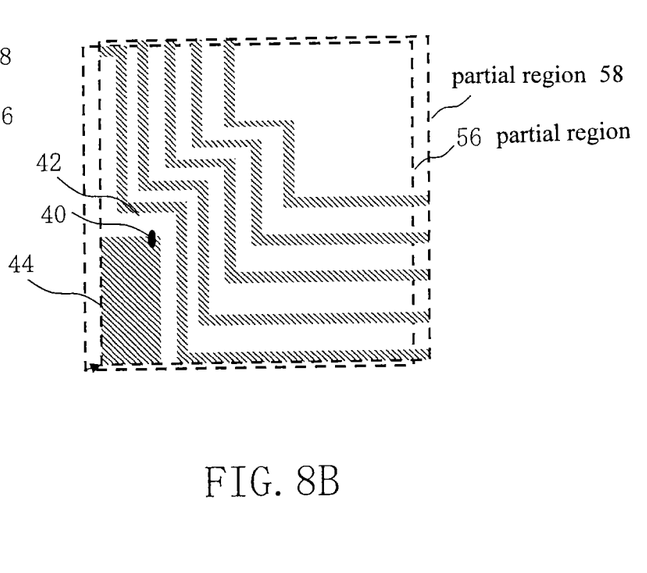

FIGS. 8A and 8B are schematic diagrams showing examples of the defect position having been shifted according to Embodiment 1. When the defect 40 is not located in the region 44 where the absorber film 16 remains but is located in the region 42 where the absorber film 16 is removed after patterning as shown in FIG. 5, it is necessary to detect the region 44 where the defect 40 is completely included in the remaining absorber film 16 as shown in FIG. 8A. Depending on the pattern data inputted into the writing apparatus 100, even though the pattern layout has been previously shifted, there may a case in which the defect 40 is not completely included in the region 44 where the absorber film 16 remains and a part of the defect 40 is out of the region 44 as shown in FIG. 8B. In such as case, detection is performed to find the region 44 where the absorber film 16 remains so as to completely include the defect 40 as shown in FIG. 8A. The detection unit 68 can detect and grasp the position of the pattern layout defined in the inputted pattern data, based on the information on the shift amount and the shift direction which have been defined as attribute data of the pattern data. The location status of the defect 40 in the shifted pattern layout can be grasped from the defect coordinates and the defect size on the substrate information. Therefore, even in the case where a part of the defect 40 is in the region 42 as shown in FIG. 8B in addition to the case where the whole of the defect 40 exists in the region 42 in the inputted pattern data, the positional relationship can be grasped from the information on the shift amount and the shift direction.

As the first detection method, using partial pattern data, the detection unit 68 detects a region in which an absorber film remains after patterning. For example, the detection unit 68 detects a pattern larger than the defect size from the region of the partial pattern data. If the defect size is defined by the diameter D, a pattern region whose width is wider than the diameter D needs to be detected.

As the second detection method, it is also preferable to use the dose map stored in the storage device 108. When a defect is not located in the region where an absorber film remains after patterning as a result of the examination, the detection unit 68 detects a region in which an absorber film remains after patterning, using the dose map.

Figure 9:
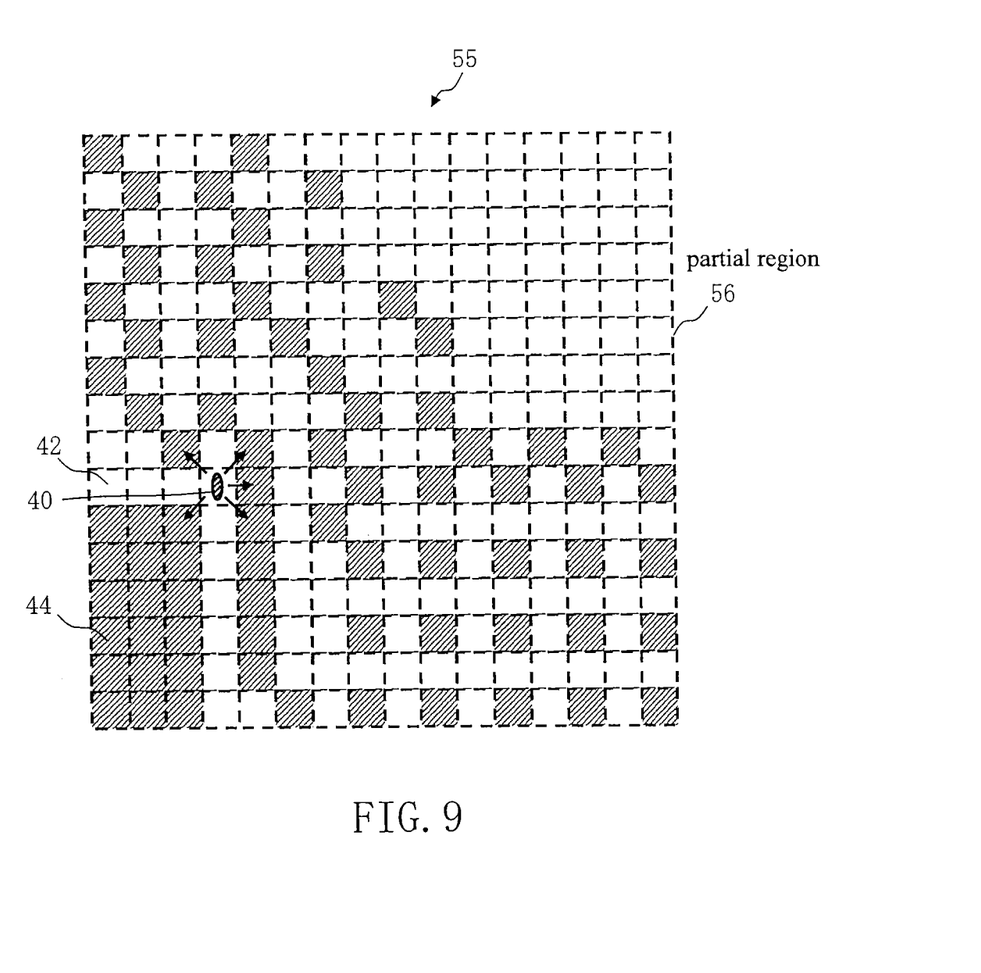
FIG. 9 shows an example of a dose map according to Embodiment 1.

FIG. 9 shows an example of the dose map according to Embodiment 1. In FIG. 9, there is typically shown a partial region 55 in the dose map equivalent to the partial region 56 of FIG. 5. In the figure, when a positive type resist is used, the mesh region shown in black by hatching indicates an irradiation region where the irradiation dose of the electron beam 200 is high. That is, in the case of the positive type resist, the mesh region shown in black by hatching is equivalent to the region 44 where the absorber film 16 mainly remains after patterning. On the contrary, the mesh region not hatched indicates an irradiation region where the irradiation dose of the electron beam 200 is low. That is, in the case of the positive type resist, the mesh region not hatched is equivalent to the region 42 where the absorber film 16 has been mostly removed not to remain after patterning. The detection unit 68 specifies the mesh corresponding to the position of the defect 40 in the dose map, and detects a mesh group of the irradiation region (region 44) whose area is larger than the defect size and which is located in the vicinity of the mesh where the defect 40 is located. In the example of FIG. 9, at the bottom left, there is a mesh group of the irradiation region (region 44) whose area is larger than the defect size. In contrast, although there exists a mesh of the irradiation region (region 44) even at the top left, the top right, the right, and the bottom right, its width is the same as that of the mesh in which the defect 40 is located. Therefore, since whether its width is wider than the diameter D of the defect 40 is unknown, it is preferable not to use the mesh for hiding the defect. Thus, by using the dose map, it becomes unnecessary to newly calculate a layout based on the pattern data (partial pattern data), which reduces the processing time.

In step S122, as the offset value calculation step, the offset value calculation unit 72 calculates an offset value for performing a correction so that the pattern layout may be shifted until the defect 40 has completely been included (hidden) by the absorber region whose area is larger than the detected defect 40. In other words, when, as a result of the examination, the defect 40 is not located in the region 44 where the absorber film 16 remains after patterning, the offset value calculation unit 72 calculates an offset value for performing a correction so that the defect 40 may be located in the region 16 where the absorber film 16 remains after patterning. Since the position of the defect 40 in the present layout can be known from the information on the shift amount and the shift direction which are defined as attribute data of the pattern data inputted into the writing apparatus 100, an offset value can be obtained by calculating a value from the position of the defect 40. It is preferable for the offset value to be defined by coordinates in order that the shift amount and the shift direction may be specified.

In step S124, as the ALN-mark detection step, the writing unit 150 detects positions of the ALN-marks 52 and 54, similar to the ALN-mark detection step (S110). The ALN-mark position acquisition unit 70 inputs position information on the ALN-marks 52 and 54 which was output from the detection circuit 164, and acquires the positions of the ALN-marks 52 and 54.

In step S126, as the offset step, the offset processing unit 74 offsets the positions of the ALN-marks 52 and 54 acquired in the ALN-mark detection step (S124), by using the offset value. Thereby, the positions of the ALN-marks 52 and 54 which are used as the references of the coordinate system of the pattern data are offset. Therefore, even when using pattern data in which the pattern layout is not formed such that the defect 40 is located in the region 44 where the absorber film 16 remains after patterning, it becomes possible to locate the defect 40 in the region 44 where the absorber film 16 remains after patterning.

In step S130, as the writing processing step, the writing unit 150 writes a pattern on the substrate 101 using the electron beam 200, based on the pattern data in which the pattern layout is not formed such that the defect 40 is located in the region 44 where the absorber film 16 remains after patterning. At this time, at least one of the positions of the ALN-marks 52 and 54 which have been offset is used as a reference of the writing coordinates. Thereby, the writing unit 150 writes a pattern on the position which has been corrected by the offset value. Consequently, the defect can be certainly located in the region 44 where the absorber film 16 remains.

According to Embodiment 1, as described above, before writing a pattern on the substrate, it is possible to check that the defect is included in the region of the absorber pattern, and then to write a pattern by using the checked writing data and the substrate. Further, according to Embodiment 1, the set of the substrate 101 where the defect 40 exists and pattern data in which the defect 40 is included in the region of the absorber pattern is unfailingly used for writing. Therefore, when a wafer is exposed using a manufactured EUV mask, a phase defect which exists in the EUV mask can be prevented from being transferred or "printed" onto the wafer.

Referring to specific examples, Embodiments have been described above. However, the present invention is not limited to these examples.

While the apparatus structure, control method, etc. not directly necessary for explaining the present invention are not described, some or all of them may be suitably selected and used when needed. For example, although description of the structure of a control unit for controlling the writing apparatus 100 is omitted, it should be understood that some or all of the structure of the control unit is to be selected and used appropriately.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A charged particle beam writing apparatus comprising:
a writing mechanism including an electron lens barrel which irradiates a substrate with a charged particle beam, to write a pattern on the substrate using the charged particle beam; and
at least one processor configured to:
read an optically readable identifier (ID) from a substrate having an absorber film which absorbs extreme ultraviolet (EUV) light, and a multilayer film with a cap film, which reflects the EUV light below the absorber film;

relate the identifier to defect position information of a particulate-generated defect that generates a phase defect occurring due to periodicity of the multilayer film becoming irregular;

store in a storage device 1) the defect position information including a position of the particulate-generated defect on the substrate based on one or more reference marks, 2) defect size information indicating a size of the defect, and 3) pattern data for writing;

input partial pattern data corresponding to a region including at least the defect in the pattern data, the defect position information of the defect based on the one or more reference marks, the defect size information of the defect, and examine whether a pattern layout is to be formed such that the defect is located in a region where the absorber film remains after patterning or whether said pattern layout is to be formed such that the defect is located in a region of multilayer film with the cap film, exposed by removing the absorber film;

calculate, when the defect is located in the region of the multilayer film with the cap film, exposed by removing the absorber film after patterning, an offset value between a defect position of the defect based on the one or more reference marks and the region where the absorber film remains after patterning for performing correction to shift an origin of pattern coordinate based on the one or more reference marks so that the defect is located in the region where the absorber film remains after patterning, wherein the writing mechanism further writes the pattern on a position corrected by the offset value, based on the pattern data indicating where the absorber film remains after patterning.

2. The apparatus according to claim 1, wherein the at least one processor is configured to:

generate a dose map for irradiating the substrate with the charged particle beam; and detect, when the defect is not located in the region where the absorber film remains after patterning, the region where the absorber film remains after patterning by using the dose map.

3. The apparatus according to claim 1, wherein the at least one processor is configured to:

detect the region where the absorber film remains after patterning, using the partial pattern data.

4. The apparatus according to claim 1, wherein the at least one processor is configured to:

generate a dose map for irradiating the substrate with the charged particle beam; and detect, when the defect that is located in the region of the opening exposing the reflective film after patterning, the region where the absorber film remains after patterning by using the dose map.

5. The apparatus according to claim 1, wherein the one or more reference marks comprise one or more alignment marks formed on the substrate, and wherein the at least one processor is configured to:

acquire a position of the one or more alignment marks, and wherein the writing mechanism performs writing using the position of the one or more alignment marks acquired, as a reference.

6. The apparatus according to claim 5, wherein the storage device stores a position specified by using the position of the one or more alignment marks as a reference, as the position of the defect on the substrate.

7. The apparatus according to claim 5, wherein the at least one processor uses a position specified by using the position of the one or more alignment marks as a reference, as the position of the defect on the substrate indicated by the defect position information.

8. A charged particle beam writing method comprising:

reading an optically readable identifier (ID) from a substrate having an absorber film which absorbs extreme ultraviolet (EUV) light, a reflective film which reflects the EUV light, and a multilayer film below the reflective film;

reading, from a storage unit, based on the identifier, defect position information of a particulate-generated defect that generates a phase defect occurring due to periodicity of the multilayer film becoming irregular, the defect position information including a position of the particulate-generated defect on the substrate based on one or more reference marks and defect size information indicating a size of the defect, and reading pattern data for writing, partial pattern data corresponding to a region including at least the defect in the pattern data, the defect position information based on the one or more reference marks, and the defect size information;

examining whether a pattern layout is to be formed such that the defect is located in a region where the absorber film remains after patterning or whether said pattern layout is to be formed such that the defect is to be located in a region that is below a region of an opening exposing the reflective film;

calculating, when the defect is located in the region of the multilayer film with a cap film, exposed by removing the absorber film after patterning, an offset value between a defect position of the defect based on the one or more reference marks and the region where the absorber film remains after patterning for performing correction to shift an origin of pattern coordinate based on the one or more reference marks so that the defect is located in the region where the absorber film remains after patterning; and writing, on the substrate using a charged particle beam, a pattern on a position corrected by the offset value, based on the pattern data indicating where the absorber film remains after patterning.

* * * * *